United States Patent
Toncich

(10) Patent No.: US 7,221,327 B2
(45) Date of Patent: *May 22, 2007

(54) TUNABLE MATCHING CIRCUIT

(75) Inventor: Stanley S. Toncich, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 251 days.

This patent is subject to a terminal disclaimer.

(21) Appl. No.: 10/982,494

(22) Filed: Nov. 5, 2004

(65) Prior Publication Data

US 2005/0095998 A1 May 5, 2005

Related U.S. Application Data

(63) Continuation of application No. 09/927,136, filed on Aug. 10, 2001, now Pat. No. 6,825,818, which is a continuation of application No. 60/283,093, filed on Apr. 11, 2001.

(51) Int. Cl.
*H01Q 1/50* (2006.01)

(52) U.S. Cl. .................. 343/860; 343/787; 333/17.3

(58) Field of Classification Search ............ 343/702, 343/787, 860
See application file for complete search history.

(56) References Cited

U.S. PATENT DOCUMENTS

| | | | |
|---|---|---|---|
| 3,239,838 A | 3/1966 | Kelleher | |
| 3,413,543 A | 11/1968 | Schubring et al. | |
| 3,569,795 A | 3/1971 | Gikow | |
| 3,676,803 A | 7/1972 | Simmons | |
| 3,678,305 A | 7/1972 | George | |
| 3,680,135 A | 7/1972 | Boyer | |
| 3,737,814 A | 6/1973 | Pond | |
| 3,739,299 A | 6/1973 | Adler | |
| 3,836,874 A | 9/1974 | Maeda | |
| 3,918,012 A | 11/1975 | Peuzin | |
| 4,122,400 A | 10/1978 | Medendorp et al. | |
| 4,236,125 A | 11/1980 | Bernard et al. | |
| 4,475,108 A | 10/1984 | Moser | |
| 4,484,157 A | 11/1984 | Helle et al. | |
| 4,494,081 A | 1/1985 | Lea et al. | |
| 4,525,720 A | 6/1985 | Corzine et al. | |
| 4,626,800 A | 12/1986 | Murakami et al. | |
| 4,733,328 A | 3/1988 | Blazej | |
| 4,736,169 A | 4/1988 | Weaver et al. | |
| 4,737,797 A | 4/1988 | Siwiak et al. | |
| 4,746,925 A | 5/1988 | Toriyama | |

(Continued)

FOREIGN PATENT DOCUMENTS

DE 40 36 866 7/1991

(Continued)

OTHER PUBLICATIONS

Chandler, S.R. et al., "Active Varactor Tunable Bandpass Filter," IEEE Microwave and Guided Wave Letters, vol. 3, Mar. 1993, pp. 70-71.

(Continued)

*Primary Examiner*—Tho Phan

(57) ABSTRACT

The present invention provides for low loss tunable matching circuits at rf frequencies. Ferro-electric materials are used to produce low loss tunable capacitors and inductors for use in matching circuits.

23 Claims, 8 Drawing Sheets

U.S. PATENT DOCUMENTS

| | | |
|---|---|---|
| 4,792,939 A | 12/1988 | Hikita et al. |
| 4,799,066 A | 1/1989 | Deacon |
| 4,835,499 A | 5/1989 | Pickett |
| 4,835,540 A | 5/1989 | Haruyama et al. |
| 4,847,626 A | 7/1989 | Kahler et al. |
| 4,975,604 A | 12/1990 | Barta |
| 5,166,857 A | 11/1992 | Avanic et al. |
| 5,173,709 A | 12/1992 | Lauro et al. |
| 5,212,463 A | 5/1993 | Babbitt et al. |
| 5,216,392 A | 6/1993 | Fraser |
| 5,227,748 A | 7/1993 | Sroka |
| 5,231,407 A | 7/1993 | McGirr et al. |
| 5,293,408 A | 3/1994 | Takahashi et al. |
| 5,307,033 A | 4/1994 | Koscica et al. |
| 5,325,099 A | 6/1994 | Nemit et al. |
| 5,388,021 A | 2/1995 | Stahl |
| 5,406,163 A | 4/1995 | Carson et al. |
| 5,416,803 A | 5/1995 | Janer |
| 5,427,988 A | 6/1995 | Sengupta et al. |
| 5,450,092 A | 9/1995 | Das |
| 5,451,915 A | 9/1995 | Katzin et al. |
| 5,459,123 A | 10/1995 | Das |
| 5,472,935 A | 12/1995 | Yandrofski et al. |
| 5,479,139 A | 12/1995 | Koscica et al. |
| 5,495,215 A | 2/1996 | Newell et al. |
| 5,496,795 A | 3/1996 | Das |
| 5,496,796 A | 3/1996 | Das |
| 5,502,422 A | 3/1996 | Newell et al. |
| 5,525,942 A | 6/1996 | Horii et al. |
| 5,557,286 A | 9/1996 | Varadan et al. |
| 5,561,307 A | 10/1996 | Mihara et al. |
| 5,561,407 A | 10/1996 | Koscica et al. |
| 5,564,086 A | 10/1996 | Cygan et al. |
| 5,574,410 A | 11/1996 | Collins et al. |
| 5,577,025 A | 11/1996 | Skinner |
| 5,583,524 A | 12/1996 | Milroy |
| 5,589,845 A | 12/1996 | Yandrofski |
| 5,600,279 A | 2/1997 | Mori |
| 5,617,104 A | 4/1997 | Das |
| 5,640,042 A | 6/1997 | Koscica et al. |
| 5,649,306 A | 7/1997 | Vannatta et al. |
| 5,652,599 A | 7/1997 | Wallace et al. |
| 5,673,188 A | 9/1997 | Lusher et al. |
| 5,701,595 A | 12/1997 | Green, Jr. |
| 5,703,020 A * | 12/1997 | Das ............................ 505/210 |
| 5,721,194 A | 2/1998 | Yandrofski et al. |
| 5,729,239 A | 3/1998 | Rao |
| 5,777,524 A | 7/1998 | Wojewoda et al. |
| 5,777,839 A | 7/1998 | Sameshima et al. |
| 5,778,308 A | 7/1998 | Sroka et al. |
| 5,830,591 A | 11/1998 | Sengupta et al. |
| 5,834,975 A | 11/1998 | Bartlett et al. |
| 5,864,932 A | 2/1999 | Evans et al. |
| 5,870,670 A | 2/1999 | Ripley |
| 5,880,921 A | 3/1999 | Tham et al. |
| 5,892,486 A | 4/1999 | Cook et al. |
| 5,908,811 A | 6/1999 | Das |
| 5,910,994 A | 6/1999 | Lane et al. |
| 5,945,887 A | 8/1999 | Makino et al. |
| 5,965,494 A | 10/1999 | Terashima et al. |
| 5,973,567 A | 10/1999 | Heal et al. |
| 5,973,568 A | 10/1999 | Shapiro et al. |
| 5,986,515 A | 11/1999 | Sakurai |
| 5,987,314 A | 11/1999 | Saito |
| 5,990,766 A | 11/1999 | Zhang |
| 6,008,659 A | 12/1999 | Traynor |
| 6,018,282 A | 1/2000 | Tsuda |
| 6,020,787 A | 2/2000 | Kim et al. |
| 6,026,311 A | 2/2000 | Willemsen Cortes et al. |
| 6,028,561 A | 2/2000 | Takei |
| 6,049,726 A | 4/2000 | Gruenwald et al. |
| 6,052,036 A | 4/2000 | Enstrom et al. |
| 6,054,908 A | 4/2000 | Jackson |
| 6,094,588 A | 7/2000 | Adam |
| 6,097,263 A | 8/2000 | Mueller et al. |
| 6,101,102 A | 8/2000 | Brand et al. |
| 6,108,191 A | 8/2000 | Bruchhaus et al. |
| 6,160,524 A | 12/2000 | Wilber |
| 6,181,777 B1 | 1/2001 | Kiko |
| 6,198,441 B1 | 3/2001 | Okabe |
| 6,216,020 B1 | 4/2001 | Findikoglu |
| 6,281,023 B2 | 4/2001 | Eastep et al. |
| 6,242,843 B1 | 6/2001 | Pohjonen et al. |
| 6,272,336 B1 | 8/2001 | Appel et al. |
| 6,278,383 B1 | 8/2001 | Endo et al. |
| 6,281,534 B1 | 8/2001 | Arita et al. |
| 6,285,337 B1 | 9/2001 | West et al. |
| 6,292,143 B1 | 9/2001 | Romanofsky |
| 6,294,964 B1 | 9/2001 | Satoh |
| 6,308,051 B1 | 10/2001 | Atokawa |
| 6,327,463 B1 | 12/2001 | Welland |
| 6,329,959 B1 | 12/2001 | Varadan et al. |
| 6,333,719 B1 | 12/2001 | Varadan |
| 6,335,710 B1 | 1/2002 | Falk et al. |
| 6,344,823 B1 | 2/2002 | Deng |
| 6,359,444 B1 | 3/2002 | Grimes |
| 6,362,784 B1 | 3/2002 | Kane et al. |
| 6,362,789 B1 | 3/2002 | Trumbull et al. |
| 6,384,785 B1 | 5/2002 | Kamogawa et al. |
| 6,404,304 B1 | 6/2002 | Kwon et al. |
| 6,456,236 B1 | 9/2002 | Hauck et al. |
| 6,462,628 B2 | 10/2002 | Kondo et al. |
| 6,489,860 B1 | 12/2002 | Ohashi |
| 6,503,786 B2 | 1/2003 | Klodzinski |
| 6,518,850 B1 | 2/2003 | Falk et al. |
| 6,518,920 B2 | 2/2003 | Proctor, Jr. et al. |
| 6,522,220 B2 | 2/2003 | Yamada et al. |
| 6,525,630 B1 | 2/2003 | Zhu et al. |
| 6,525,691 B2 | 2/2003 | Varadan et al. |
| 6,531,936 B1 | 3/2003 | Chiu et al. |
| 6,559,737 B1 | 5/2003 | Nagra et al. |
| 6,571,110 B1 | 5/2003 | Patton et al. |
| 6,590,468 B2 * | 7/2003 | du Toit et al. ............ 333/17.3 |
| 6,600,456 B2 | 7/2003 | Gothard et al. |
| 6,653,977 B1 | 11/2003 | Okabe et al. |
| 6,667,723 B2 | 12/2003 | Forrester |
| 6,686,817 B2 | 2/2004 | Zhu et al. |
| 6,721,293 B1 | 4/2004 | Komulainen et al. |
| 6,727,535 B1 | 4/2004 | Sengupta et al. |
| 6,819,203 B2 | 11/2004 | Taniguchi |
| 6,825,818 B2 * | 11/2004 | Toncich ..................... 343/860 |
| 6,842,086 B1 | 1/2005 | Zennamo, Jr. |
| 6,864,757 B2 * | 3/2005 | du Toit et al. ................ 333/34 |
| 2001/0026243 A1 | 10/2001 | Koitsalu et al. |
| 2001/0043159 A1 | 11/2001 | Masuda et al. |
| 2002/0049064 A1 | 4/2002 | Banno |
| 2002/0093400 A1 | 7/2002 | Zhu et al. |
| 2002/0149526 A1 | 10/2002 | Tran et al. |
| 2002/0149535 A1 | 10/2002 | Toncich |
| 2002/0175878 A1 | 11/2002 | Toncich |
| 2003/0062971 A1 | 4/2003 | Toncich |
| 2003/0134665 A1 | 7/2003 | Kato et al. |
| 2004/0087280 A1 | 5/2004 | Watanabe et al. |
| 2004/0162047 A1 | 8/2004 | Kasahara et al. |
| 2004/0196121 A1 | 10/2004 | Toncich |
| 2004/0212457 A1 | 10/2004 | Eden et al. |
| 2004/0263411 A1 | 12/2004 | Fabrega-Sanchez et al. |
| 2005/0007291 A1 | 1/2005 | Fabrega-Sanchez et al. |

FOREIGN PATENT DOCUMENTS

| | | |
|---|---|---|
| DE | 100 24 483 | 11/2001 |
| DE | 101 37 753 | 2/2003 |
| EP | 0 125 586 | 11/1984 |

| | | |
|---|---|---|
| EP | 0 346 089 | 12/1989 |
| EP | 0 473 373 | 3/1992 |
| EP | 0 531 125 | 3/1993 |
| EP | 0 631 399 | 12/1994 |
| EP | 0 637 131 | 2/1995 |
| EP | 0 680 108 | 11/1995 |
| EP | 0 795 922 | 9/1997 |
| EP | 0 854 567 | 7/1998 |
| EP | 0 872 953 | 10/1998 |
| EP | 0 881 700 | 12/1998 |
| EP | 0 892 459 | 1/1999 |
| EP | 0 909 024 | 4/1999 |
| EP | 1 043 741 | 10/2000 |
| EP | 1 058 333 | 12/2000 |
| EP | 1 248 317 | 10/2002 |
| GB | 2 240 227 | 7/1991 |
| JP | 63 128618 | 6/1988 |
| JP | 05182857 | 7/1993 |
| JP | 2001 338839 | 12/2001 |
| WO | WO 82/03510 | 10/1982 |
| WO | WO 94/27376 | 11/1994 |
| WO | WO 00/35042 | 6/2000 |
| WO | WO 00/62367 | 10/2000 |
| WO | WO 03/058759 | 7/2001 |
| WO | WO 02/084798 | 10/2002 |

OTHER PUBLICATIONS

Chang, C. et al., "Microwave Active Filters Based on Coupled Negative Resistance Method," IEEE Trans. on Microwave Theory & Techs., vol. 38, No. 12, Dec. 1990, pp. 1879-1884.

Cohn, S.B., "Dissipation Loss in Multiple-Coupled-Resonator Filters," Proc. IRE 47, Aug. 1959, pp. 1342-1348.

Cuthbert, T., "Broadband Impedance Matching -Fast and Simple", RF Design, Cardiff Publishing Co., vol. 17, No. 12, Nov. 1994, pp. 38, 42, 44, 48, XP000477834.

Dishal, M., "Alignment and Adjustment of Synchronously Tuned Multiple Resonator-Circuit Filters," Proc. IRE 39, Nov. 1951, pp. 1448-1455.

Erker et al., "Monolithic Ka-Band Phase Shifter Using Voltage Tunable BaSrTiO3 Parrallel Plate Capacitors", IEEE Microwave and Guided Wave Letters, IEEE Inc., vol. 10, No. 1, Jan. 2000, pp. 10-12 XP-000930368.

Fubini, E.G. et al., "Minimum Insertion Loss Filters," Proc. IRE 47, Jan. 1959, pp. 37-41.

Fujita, K. et al., "A 15.6 GHz Commercially Based 1/8 GaAs Dynnamic Presealer," 1989 IEEE GaAs IC Symposium, pp. 113-116.

Galt, D. et al., "Ferroelectric Thin Film Characterization Using Superconducting Microstrip Resonators", IEEE Trans on Appl Superconductivity Jun. 1995 IEEE, pp. 2575-2578, vol. 5, No. 2, Piscataway, NJ, USA.

Getsinger, W.J., "Prototypes for Use in Broadbanding Reflection Amplifiers," IEEE Trans. PTGMTT-11, Nov. 1963, pp. 486-497.

Getsinger, W.J. et al., "Some Aspects of the Design of Wide-Band Up-Converters and Nondegenerate Parametric Amplifiers," IEEE Trans. PTGMTT-12, Jan. 1964, pp. 77-87.

Gevorgian, Spartak S. et al., "HTS/Ferroelectric Devices for Microwave Applications", IEEE Transactions on Applied Superconductivity, Jun. 1997, pp. 2458-2461, IEEE, USA.

Hopf, B. et al., "Coplanar MMIC Active Bandpass Filters Using Negative Resistance Circuits," 1994 IEEE MTT-S Symposium Digest, pp. 1183-1185.

Hunter, I.C. et al., "Electronically Tunable Microwave Bandpass Filters," IEEE Trans. on MTT, vol. 30, No. 9, Sep. 1982, pp. 1354-1367.

Jose et al., "Experimental investigations on electronically tunable microstrip antennas," Feb. 05, 1999, Microwave and optical technology letters, vol. 20, No. 3, pp. 166-169.

Kapilevich, B., "Understand the Operation of Channelized Active Filters," Microwaves & RF, Jan. 1997, pp. 89-92.

Kapilevich, B., "Variety of Approaches to Designing Microwave Active Filters," Proc. 27th European Microwave Conference, Jerusalem, vol. 1, 1997, pp. 397-408.

Karacaoglu, U. et al., "High Selectivity Varactor-Tuned MMIC Bandpass Filter Using Lossless Active Resonators," 1994 IEEE MTT-Symposium Digest, pp. 1191-1194.

Katzin, P. et al., "Narrow-band MMIC Filters with Automatic Tuning and Q-Factor Control," 1993 IEEE MTT-S Int. Microwave Symposium Digest, pp. 403-406.

Keis, V.N. et al., "20GHz tunable filter based on ferroelectric (BaSr)TiO3 film varactors", Electronics Letters, May 28, 1998, vol. 34, No. 11, IEE Stevenage, GB.

Kotzebue, K.L., "Broadband Electronically-Tunable Microwave Filters," 1960 IRE Wescon Convention Record, Part 1, 21-27.

Kozyrev, A., et al., "Ferroelectric Films: Nonlinear Properties and Applications in Microwave Devices", 1998 IEEE MTT-S Digest, May 1998, pp. 985-988, 1998 IEEE MTT-S Intl Baltimore, MD, USA, IEEE, USA.

Krautkramer, V.W. et al., "Resonanztransformatoren mit drel Reaktanzen als transformierende Filter", Bulletin des Schweizerischen Elekrotechnischen Vereins, Zurich, CH, vol. 64, No. 23, Nov. 10, 1973, pp. 1500-1509, XP00218530.

Kuh, E.S. et al., "Optimum Synthesis of Wide-Band Parametric Amplifiers and Converters," IRE Trans. PCCT-8, Dec. 1961, pp. 410-415.

Louhos, J.P. et al., "Electrical Tuning of Integrated Mobile Phone Antennas," Nokia Mobile Phones, pp. 69-97 (Sep. 15, 1999).

Makioka, S. et al., "A High Effciency GaAs MCM Power Amplifier for 1.9 GHz Digital Cordless Telephones," IEEE 1994 Microwave & Millimeter-Wave Monolithic Cir. Sym., pp. 51-54.

Matthaei, G.L., "An Electronically Tunable Up-Converter," Proc. IRE 49, Nov. 1961, pp. 1703-1704.

Nauta, B., "A CMOS Transconductance-C Filter Technique for Very High Frequencies," IEEE Journal of Solid-State Circuits, vol. 27, No. 2, Feb. 1992, pp. 142-153.

Panayi, P.K. et al., "Tuning Techniques for the Planar Inverted-F Antenna," National Conference on Antennas and Propagation Publication, No. 461, pp. 259-262, (Apr. 1999).

Presser, A., "Varactor-Tunable, High-Q Microwave Filter," RCA Review, vol. 42, Dec. 1981, pp. 691-705.

Sleven, R.L., "Design of a Tunable Multi-Cavity Waveguide Band-Pass Filter," 1959 IRE National Convention Record, Part 3, pp. 91-112.

Smuk, J. et al., "MMIC Phase Locked L-S Band Oscillators," 1994 IEEE GaAs Symposium Digest, pp. 27-29.

Taub, J.J. et al., "Design of Three-Resonator Dissipative Band-Pass Filters Having Minimum Insertion Loss," Proc. IRE 45, pp. 681-687 (May 1957).

Toncich et al., "Data Reduction Method for Q Measurements of Stripline Resonators", IEEE Transactions in MTT, vol. 40, No. 9, Sep. 1992, pp. 1833-1836.

Toyoda, S., "Quarter-wavelength Coupled Variable Bandstop and Bandpass Filters Using Varactor Diodes," IEEE Trans. on MTT, vol. 30, No. 9, Sep. 1982, pp. 1387-1389.

Varadan, V.K. et al., "Design and Development of Electronically Tunable Microstrip Antennas," IOP Publishing Ltd., pp. 238-242 (1999).

Vendik, O.G. et al., "1GHz tunable resonator on bulk single crystal SrTiO3 plated with Yba2Cu307-x films", Electronics Letters, Apr. 13, 1995, pp. 654-656, vol. 31, No. 8, IEE Stevenage, GB.

* cited by examiner

TUNABLE MATCHING CIRCUIT

RELATED APPLICATIONS

This application is a continuation application of U.S. application Ser. No. 09/927,136, filed Aug. 10, 2001 now U.S. Pat. No. 6,825,818, which claims the benefit of U.S. Provisional Application 60/283,093, filed Apr. 11, 2001 which is hereby incorporated by reference. In addition, this application relates to U.S. patents "Tunable Ferro-electric Filter", U.S. Pat. No. 6,690,251, filed Jul. 31, 2001; "Tunable Ferro-electric Multiplexer," U.S. Pat. No. 6,639,491B1, filed Jul. 24, 2001; and "Low Loss Tunable Ferro-electric Device and Method of Characterization," U.S. Pat. No. 6,690,176 filed Aug. 8, 2001, which are hereby incorporated by reference.

BACKGROUND

Description of Related Art

Matching circuits are widely used to transform the impedance of the various components within a circuit to a target impedance. The input to the matching circuit may be an RF signal, carrying information. The output to the matching circuit may also be an RF signal, carrying information. The matching circuit may precede or follow a component. The component has an input and an output impedance. If the component follows the matching circuit in the signal path, the target impedance of the component is its input impedance. If the component precedes the matching circuit in the signal path, the target impedance of the component is its output impedance.

The matching circuit functions to set the impedance seen by the signal to the target impedance by compensating for the difference between the impedance of interest and the target impedance. The compensation of the impedance is determined by the capacitance and the inductance of the matching circuit and by the configuration of the matching circuit. A wide range of impedance matching and transfer function circuits can be realized by using lumped element inductors or capacitors or both. At higher frequency (above about 1 GHz) it is often advantageous to replace either lumped element inductors or capacitors or both with distributed transmission line networks. The usefulness of this replacement is also dependant on the dielectric constant (DK) of the substrate, as well as area constraints.

Different arrangements of matching circuits are well known in the art. Some examples are: series capacitor, shunt capacitor; series capacitor, shunt inductor; series inductor, shunt capacitor; etc. A common configuration for a matching circuit is shunt capacitor, series inductor, shunt capacitor. Tranformers, and even resistive networks, can be used, if the insertion loss can be tolerated.

In general, matching circuits should have minimum added loss to prevent added degradation in the information signal. Excess loss increases the demands made on other components in an electronic system, especially the active elements such as amplifiers. In some cases, like at the input to a low noise amplifier (LNA), increased signal loss cannot be made up (compensated for) by simply increasing the gain of the LNA.

The impedances of the components and the matching circuits are frequency dependent. The impedance is only matched at a single operating frequency, or over a limited band of frequencies. If the designer wishes to operate the device at more than one frequency band, compromises must be made.

Antenna matching networks in wireless handsets will serve as an example. Since present dual band handsets typically use only a single antenna, the present solution is to match impedances at a frequency in the middle of the range of operating frequencies. The impedance is mismatched at all frequencies besides the middle frequency. This increases power loss in either band.

A second option is to use different components and matching circuits for different operating frequencies. The impedance match may be better this way, but the extra cost of manufacturing and overall size of the combined circuit may be prohibitive. It will be appreciated that if one of each component could be well matched at all desired operating frequencies, there would be a great savings in circuit size and power consumption. A tunable matching circuit would solve this problem.

In code division multiple access (CDMA) handsets, matching circuits are required between the duplexer and antenna (single band phone) or the diplexer or multiplexer and antenna in dual or multi-band handsets as well as before and after power amplifiers (PA's) and low noise amplifiers (LNA's).

Prior to the invention, low loss tunable matching circuits at frequencies above about 200 MHz had not been achieved, although attempts had been made. Those attempts include matching circuits using varactor diodes as shown in U.S. Pat. No. 6,198,441 B1, hereby incorporated by reference. Specifically, a circuit comprising a series inductor and a shunt varactor diode has been used to make tunable matching circuits. The problem with this circuit though, is that the losses are intolerably high, particularly for use in a portable communication device. Further, varactor diodes are quite temperature sensitve, and have proven to possess uncertain rf performance from lot to lot. It will be appreciated that a low loss tunable matching circuit would be useful in many applications, but particularly in a portable wireless communication device.

SUMMARY

The objective of this invention is to provide a low loss tunable matching circuit. The matching circuit may be for use in portable wireless communication devices. Low-loss tunable f-e components may be used to make a matching circuit. This may be accomplished by using a f-e tunable capacitor or inductor. Matching circuits can be implemented by lumped elements placed in series or shunt or by distributed network elements or by some combination of the two. In distributed element matching, f-e films can be used in planar (microstrip, stripline, CPW, among others) passive matching circuits to vary the permittivity of the underlying substrate, thus effecting a change in the matching circuit's or resonator's electrical length. The use of planar matching circuits is familiar to anyone trained in the art of amplifier or circuit design. The matching networks here can be hybrids and couplers as well as the more conventional distributed inductive and capacitive structures.

The advantages of the invention include lower insertion loss of the matching circuit and a better impedance match resulting in lower insertion loss of the component or components being matched. Furthermore, better matching means that there will be less interference due to reflection within a circuit.

Additionally, portable wireless communication devices will have longer battery lifetimes and talk times.

BRIEF DESCRIPTION OF THE DRAWINGS

FIG. 2b is a plan view of the first metal layer in the overlay capacitor of FIG. 2a.

FIG. 2c is a cross-sectional view of the overlay capacitor of FIG. 2a taken along line B in FIG. 2a.

FIG. 3 illustrates an enlarged view of a portion of FIG. 2a.

Use of the same reference symbols in different figures indicates similar or identical items.

DETAILED DESCRIPTION

Figure 1A:
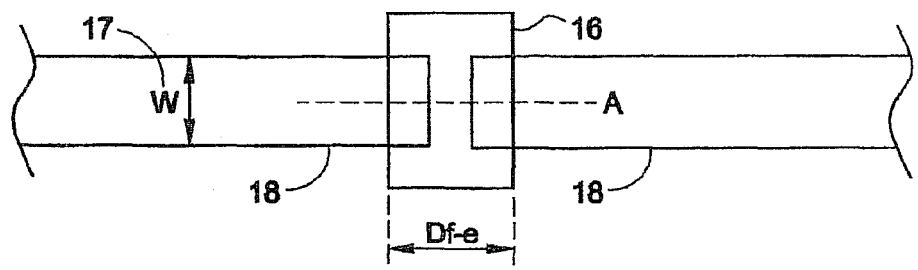
FIG. 1a is a plan view of a ferro-electric gap capacitor.

The objective of this invention is to provide a low loss tunable matching circuit. Low-loss tunable f-e components may be used to make a matching circuit. This may be accomplished by using a f-e tunable capacitor or, to a limited extent, an inductor. Matching circuits can be preferably implemented by lumped elements placed in series or shunt or by distributed network elements or by some combination of the two. In distributed element matching, thin or thick f-e films can be used in planar (microstrip, stripline, CPW, among others) passive matching circuits to vary the permittivity of the underlying substrate, thus effecting a change in the matching circuit's or resonator's electrical length or characteristic impedance. The use of planar matching circuits is familiar to anyone trained in the art of amplifier or circuit design. The matching networks here can be hybrids and couplers as well as the more conventional distributed inductive and capacitive structures.

If lumped element matching components are used, then f-e based tunable capacitors can be used in a similar manner to effect a change in an amplifier's matching network. Matching circuits are well known to those in the art. A preferred matching network with lumped elements would be the same as those known in the art, except that a f-e material would be used to change the capacitance of a capacitor.

The design of f-e tunable capacitors for use in matching circuits will now be described. The total loss of a capacitor, $L_t$, whether tunable or not, is given by a ratio of its dissipated to stored energy, where the energy is stored in the electric field and dissipated in resistance, i.e., $L_t$=(dissipated energy)/(stored energy). The inverse of this loss is the quality factor, $Q_c$. For a capacitor, $L_t$ can be given by the quantity $(\omega * R_s * C)$, where $\omega$ is the frequency in radians, $R_s$ is the series resistance of the capacitor, and C is the capacitance. For example, for a 1.0 pF tunable capacitor to have a $Q_u$=250 at 2.0 GHz requires that $R_s$ be 0.32Ω (ohms). To minimize loss (obtain a low $R_s$), requires an accounting of all loss mechanisms present and an elimination of these loss mechanisms if possible.

The loss determination of a f-e capacitor does not depend on its topology, i.e, whether it is an overlay, gap, or interdigital (IDC) capacitor.

For f-e devices, the total loss is governed by summing each source contribution as follows:

$$L_t = L_{geom} + L_{attach} + L_{metal} + L_{sub} + L_{rad} + L_{meas} + L_{f\text{-}e};$$

where $L_{geom}$ is derived from the topology of the capacitor, $L_{attach}$ is loss due to device attachment, $L_{metal}$ is the total metal loss, $L_{sub}$ is the base substrate loss (if present), $L_{rad}$ is the radiation loss, both desired and undesired, $L_{meas}$ is the total loss arising from measurement errors, and $L_{f\text{-}e}$ is the f-e loss tangent.

This loss allocation can first be used to obtain an accurate value of $L_{f\text{-}e}$ (or f-e tan δ) at the desired operating frequency in the manner in which the f-e capacitor will be used. To correctly derive $L_{f\text{-}e}$, one must eliminate or constrain all of the other loss contribution sources just described. For example, $L_{geom}$ will vary according to topology, being best for an overlay capacitor, worse for a gap capacitor, and much worse for an IDC capacitor. Although this loss can be reduced and controlled, it is inherent to a device. Consequently, the choice of topology for a given f-e capacitor will affect the best possible $Q_c$ attainable from the f-e capacitor. Electromagnetic (EM) software can establish a baseline loss for a desired geometry, assuming a lossless f-e film. This baseline loss represents the best (lowest) loss for a given geometry.

In general, a gap capacitor is easiest to fabricate. An IDC is next easiest, and an overlay capacitor is hardest of these three. Compared to an IDC, the gap capacitor will have a better Q but lower capacitance per unit cross section (W in FIG. 1a). The IDC's capacitance is greater due to the use of a number of fingers per unit cross section. For many communication filter applications, however, large capacitance (C≧4.0 pF) is not needed. Thus, a gap capacitor often can provide adequate capacitance. The inherently high value of κ for most f-e films helps provide relatively high capacitance per unit cross section, W, compared to a conventional gap capacitor.

$L_{attach}$ arises from discrete device attachment techniques, including, for example, solder, silver paint, or wire bonding. These attachment losses may be large and unpredictable. The lowest losses are achieved by direct fabrication of the f-e capacitor to the resonator or other RF circuitry, thus minimizing if not eliminating this loss component.

The inherent loss of a stand-alone f-e capacitor is of little consequence. What is of much greater consequence is any added loss arising from the attachment of the f-e capacitor to a circuit. Even if the f-e capacitor were lossless, should a large loss connection be used, the overall effect is that of a lossy f-e device. For example, if a Q≧250 at 2.0 GHz is desired for a capacitance of 1.0 pF, then the total series resistance $R_s$ must be ≦0.32 ohm. Any additional loss will thus further reduce the Q of this capacitor. That this additional loss is external to the actual capacitor is irrelevant. Even unavoidable loss mechanisms, such as those due to mounting, for example, lower the effective Q of the capacitor from the perspective of its effect on the system.

For minimum added loss, the connection between the f-e capacitor and the resonator should provide the lowest added resistance. Thus, the electric currents and charges associated with the f-e capacitor should see a minimum added loss. Conventional bonding or mounting techniques, such as (but not limited to) soldering, wire bonding or silver paint or paste do not provide for such a low loss, controllable bond.

The added, unpredictable loss arising from the use of such bonding methods degrades the realized Q regardless of whether or not the f-e capacitor is being used for resonator tuning purposes or characterization of an f-e film. Thus, for best performance (lowest loss) the f-e capacitor structure should be directly fabricated onto or with the resonator it is meant to tune or onto other essential RF circuitry. Only by direct fabrication can there be a minimum loss transition for electromagnetic (EM) sources (currents) from the f-e tuning elements to the resonator. The desirable effects of direct f-e capacitor fabrication onto or with a resonator can be enhanced by the lack of sharp corners or transitions.

Factors for $L_{metal}$ include the surface roughness (SR) of the metal, metal thickness as compared to skin depth, δs, and conductivity. SR may be effectively eliminated as a factor if SR is less than approximately 10 micro inches root mean square (rms) for operating frequencies in the L and S band (1–4 GHz). The metal thickness may be reduced as a factor if the thickness is 1.5 δs or greater, or effectively eliminated if the thickness is ≧5 δs. For electrode contacts, metal thickness ($t_m$) can be approximately 1.5 δs. For the case of electromagnetic resonators, where a travelling or standing wave must be supported, i.e., where the metal in question extends for an appreciable fraction of a wavelength (about 10% or greater), the metal thickness should be closer to about 5 δs or greater.

Conductivity is best for silver, copper and gold (Ag, Cu, and Au, respectively). Thus, $L_{metal}$ can be reduced and controlled, but not eliminated as a factor. Its effect, however, can be calculated by expressions well known to those skilled in the art, or by using line calculator tools available in commonly used circuit simulators, such as Eagleware or Touchstone. Further, precise fabrication control can bound geometric variations in $L_{metal}$.

The loss contribution represented by $L_{sub}$ may be minimized by choosing a low loss substrate with a loss tangent less than 0.001 and preferably less than 0.0005 at the operating frequency of interest. Suitable materials include >99% pure alumina, a best current choice for loss/cost benefits. Sapphire or MgO are better than alumina in that they have lower loss tangents, but they are more expensive. All these materials will accept f-e thin films without buffer layers and have a surface roughness that is acceptable with little or no further polishing. Semiconductor substrates are poor choices because of their relatively high conductivity. In addition to the factors of loss tangent, surface roughness and price, suitable substrates should not be brittle, can be fabricated as larger area wafers, and can be easily metallized without extensive pre-processing.

Separating out $L_{sub}$ from the total loss of a composite substrate (f-e film plus substrate) can be achieved by using EM field or circuit simulation software. For example, Sonnet, Momentum, or IE3D may be used. Thus, $L_{sub}$ can be reduced significantly and calculated precisely.

$L_{rad}$ can be eliminated by proper shielding and design, and so is typically not a factor. It should be noted that a wide variety of filters, especially planar filters such as combline or hairpin, depend upon radiative coupling to achieve their desired performance. In these cases, one should ensure that the unwanted, stray coupling is reduced, if not eliminated.

$L_{meas}$ can add significantly to the circuit loss error because small, added loss significantly reduces the measured Q of the device-under-test (DUT) or system thus obscuring the intrinsic Q of the DUT. The conventional method for measuring dielectric constant and loss tangent in a material is the cavity perturbation technique, which is well known to anyone skilled in the art. At L-band, however, the size of the cavity becomes quite large. When characterizing thin films (as opposed to bulk) with film thickness ≦1.5 μm, such as f-e films, the problem becomes very difficult as measurement errors can be severe. Furthermore, one should characterize an f-e capacitor (or filter) in a manner most similar to how it will be used. Thus, the preferred way to characterize f-e compounds or films is by microstrip resonator techniques.

For the purposes of determining f-e film characteristics and characterizing f-e capaictors, microstrip techniques are preferred to, for example, stripline or other volumetric techniques for f-e film characterization for the following reasons:

1) Microstrip circuits are planar systems with no top cover, so no bonding of hard substrates as top covers is required. So there is also no need for continuity of ground planes (top to bottom) as needed in a stripline, for example.
2) Preferably gap capacitors, and alternatively, IDC's, can be readily fabricated and measured.
3) A large body of knowledge exists as to the characterization of microstrip resonators.
4) No complex fixturing or fabrication or both are needed as are required for dielectric cavities, for example.

One should measure high-Q circuits using resonator techniques because broadband measurement may not accurately resolve sub-ohm resistive losses at RF/microwave frequencies with any accuracy. For the same reason, LRC meters are not a good choice.

Measurement at radio frequency is requried to correctly obtain Rs and consequently Q, for an f-e capacitor, since low frequency measurement, especially those below about 10 to 100 MHz, is dominated by a large parallel resistance, Rp, that shunts the capacitance in question. The dominance of Rp, along with the relatively small values of the capacitance in question (≦4.0 to 5.0 pF) prevents reliable Q (and therefore Rs) measurement at low frequencies.

When used to measure losses, wafer probe stations must be carefully used because it is difficult to calibrate out resistive and inductive loss at RF/microwave frequencies. Probe tips along with their ground connections are also sensitive to placement on the DUT as well as the pressure used to apply them. As a consequence, it is better to use a resonant test circuit that allows for direct measurement of the desired parameters in a way that does not require individual device loss measurements.

Thus, for measurements on resonant circuits, a network analyzer is the preferred choice. To minimize measurement loss and attain the most accurate measurement, one should calibrate out loss to the DUT, perform a full two port calibration of the network analyzer, and use averaging for calibration and measurement. Finally, proper analysis of the measured data, such as that outlined in "Data Reduction Method for Q Measurements of Strip-Line Resonators," IEEE Transactions in MTT, S. Toncich and R. E. Collin, Vol. 40, No. 9, September 1992, pp. 1833–1836, hereby incorporated by reference, is required to accurately extract the Q, or loss, of the capacitor under test.

Using the results of above discussion to minimize, eliminate, or bound each of the foregoing losses, the total loss may be re-expressed as:

$$L_t = L_{geom} + L_{metal} + L_{f-e} + \Delta L_{misc}$$

As discussed above, both $L_{geom}$ and $L_{metal}$ may be quantified and removed analytically to obtain an accurate measure of $L_{f-e}$. $L_{geom}$ can be determined from an accurate electromagnetic simulation of the circuit based on a lossless f-e material assumption. $L_{metal}$ can be determined using the expressions for metal loss assuming conductivity, SR (if applicable), and skin depth. The final term, $\Delta L_{misc}$, represents a combination of the incomplete removal of the other loss mechanisms or from the finite bounds on or incomplete removal of $L_{metal}$ and $L_{geom}$ or both. As such it represents an irreducible error term. For accurate measurements of f-e film/component properties, it should be minimized and bounded, as described in the preceding sections.

Finally, to reduce the effect of $L_{f-e}$ to a minimum one must use selective f-e film deposition to place the f-e film only in regions where it is needed for tuning and nowhere else.

The process of accounting for all loss mechanisms and eliminating or bounding these losses not only determines f-e loss but also establishes correct design guidelines for low-loss tunable filters. Knowledge of $L_{f-e}$ gives the designer a baseline for the f-e film that is necessary for doing any type of optimum design using f-e films. This knowledge is necessary if one is to effectively trade-off loss tangent for tunability, for example. In short, accurate fabrication and measurement techniques result in consistent f-e film loss characterization and application.

Given the above techniques for minimizing loss, preferred embodiments for the three types of f-e capacitors may now be discussed. It will be appreciated, that although these designs are for use in the L band (1–2 GHz), the teachings of the present invention may be used to design f-e capacitors for other frequency bands.

Figure 1B:
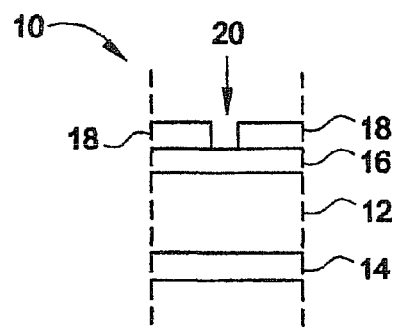
FIG. 1b is a cross-sectional view of the ferro-electric gap capacitor of FIG. 1a taken along line A.

A preferred f-e tunable gap capacitor 10 is shown in FIGS. 1a and 1b for use in the cellular band (800 to 1000 MHz) and the L-band (1–2 GHz) for wireless handsets. The gap capacitor 10 is preferably formed on a ≧99% pure, 0.5 to 1.0 mm thick alumina, MgO, or sapphire substrate 12, having an SR less than a 5.0 micro inch RMS. Alternatively, the gap capacitor can be directly patterned on the front or rear face or a side-wall of any number of resonators structures. Examples are coaxial, monoblock or stripline resonators. Such a capacitor should be fabricated as close to its point of electrical connection to the resonator as possible.

The substrate 12 may have a metal ground plane 14 depending on other requirements. However, the preferred embodiment is without a ground plane to minimize stray capacitance. Preferably, a f-e layer 16 of approximately 0.1 to 2.0 microns in thickness formed of BSTO or other suitable or desirable f-e material for maximum capacitance and tuning range is deposited on the substrate 12. More preferably, layer 16 is 0.5 to 1.0 microns in thickness. The Ba/Sr fraction, doping, alloying, mixing with other components, and/or annealing determine the desired tuning characteristics and loss (tan δ), and-therefore Q also.

Generally, it is preferred that the tuning characteristics meet the minimum required tuning range with the minimum tuning voltage. Preferably, x=0.5 in the $Ba_xSr_{1-x}TiO_3$ composition for room temperature operation, regardless of doping with other elements and pre- or post-process annealing. It will be appreciated that other f-e materials beside BSTO may be used as well. A metal layer 18 formed on the f-e layer 16 defines a gap 20 that is preferentially 3.0 to 5.0 microns wide. Preferably, metal layer 18 is 0.5 to 6.0 microns thick. More preferably, metal layer 18 is 1.5 to 2.5 microns thick. It will be appreciated that the gap 20 can be wider or narrower than this range depending on requirements and processing equipment. For minimum added loss in the PCS band, the resulting capacitance will be approximately 0.6 pF to 1.5 pF at 0 volts DC while for the cellular CDMA band it will be about 1.0 pF to 3.0 pF. The width of the capacitor, W 17, will further determine the f-e capacitance, depending on the particular f-e film used and the desired gap 20. The width will typically be from 0.25 mm to 2.0 mm. The capacitance is typically 0.6 to 3.0 pF. The resulting capacitor should provide a Q of at least 160 at 2.0 GHz.

To minimize the added loss from the f-e film, selective deposition or etching or both must be used, i.e., the f-e film is located only where needed for tuning and nowhere else as stated above. For example, in the gap capacitor 20 of FIG. 1a, one could deposit the desired f-e film 16 in a narrow region $D_{f-e}$ around the gap 20, as shown in FIG. 1a. $D_{f-e}$ should be large enough to ensure that the gap 20 can be repeatedly patterned over the f-e film in manufacturing (allowing for mask alignment tolerance) and to cover the needed area under the gap 20 for tuning purposes. For the L-band PCS filters, $D_{f-e}$=0.2 to 0.5 mm is adequate with 0.2 mm preferred. As the operating frequency increases $D_{f-e}$ can decrease. As the operating frequency decreases, $D_{f-e}$ can increase.

F-E film properties and fabrication will play a significant role in overall capacitor loss. Many techniques exist to mitigate and minimize f-e film loss. One feature of f-e films is that f-e film loss and tunability usually have an inverse relationship. That is, they usually must be traded off against each other. The greater the f-e κ tuning range, the greater the f-e loss in most cases.

Thus, even though f-e materials can achieve a κ tuning range of about 3 to 1, less tuning may be acceptable for a given matching circuit application. In that case, less tuning would be chosen, with the benefit of less loss.

The effect of κ tunability on frequency tunability is determined by the matching circuit topology. This effect must also be considered in choosing an f-e material. But without accurate characterization of the f-e loss to f-e κ tunability trade-off, it will be difficult for a designer to choose an optimum f-e material. Accurate characterization of this trade-off allows a designer to choose an optimum f-e material (providing the lowest loss while meeting the tuning requirements).

With respect to $L_{geom}$ for a gap capacitor, the major contributions to loss are the four corners formed by the gap. These losses can be reduced by rounding the corners.

In comparison to gap and interdigital capacitors, an overlay capacitor has the lowest $L_{geom}$. An overlay capacitor is an example of a parallel plate geometry where the plate dimensions (length and width) are much greater than the plate separation. Given such a geometry, most of the electric field between the plates is uniform except for fringing along the edges. The fringing effect can be reduced significantly by the use of a guard band, as is well known in the art. Thus, the geometric loss from a parallel plate capacitor is quite low. In addition, parallel plate geometries can provide high capacitances along with high tuning from small control voltage swings.

Figure 2A:
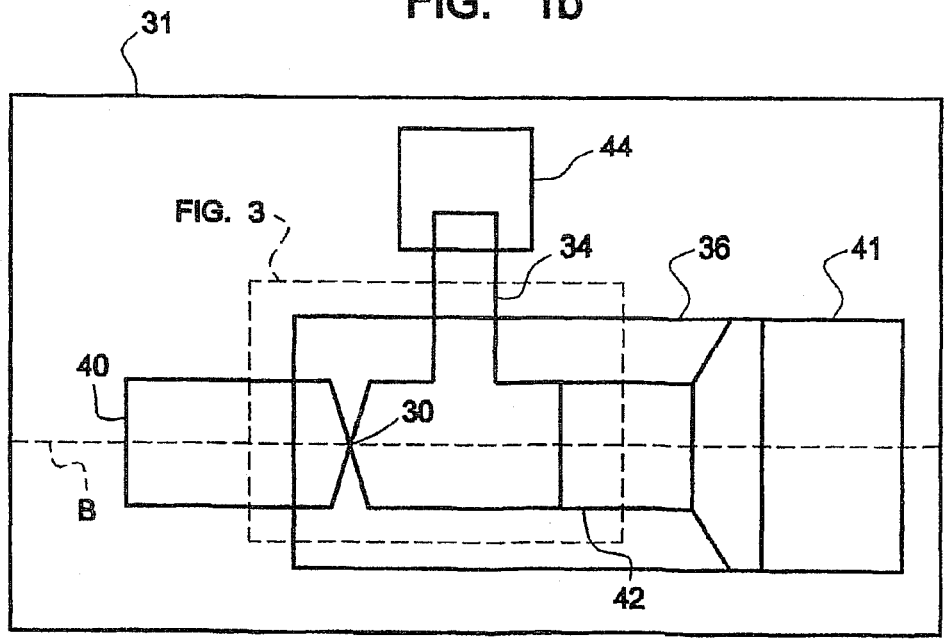
FIG. 2a is a plan view of a ferro-electric overlay capacitor, along with an accompanying DC blocking capacitor.
Figure 2B:
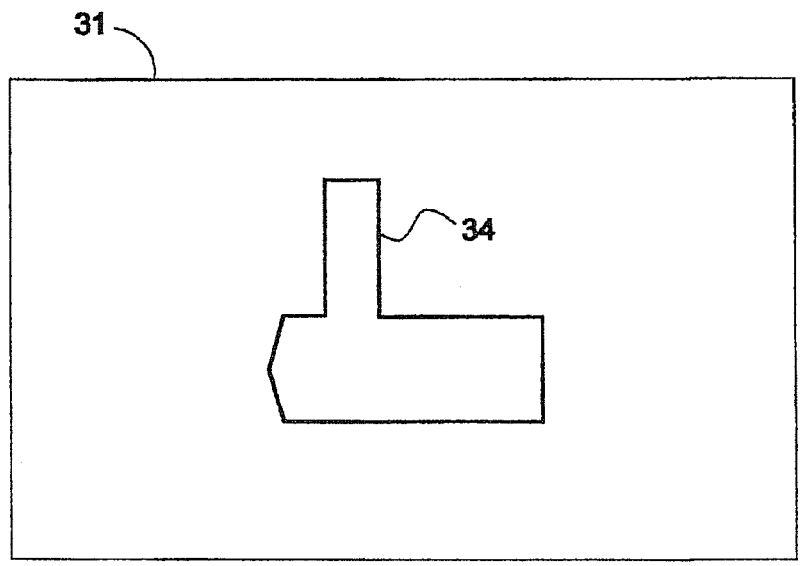
Figure 2C:
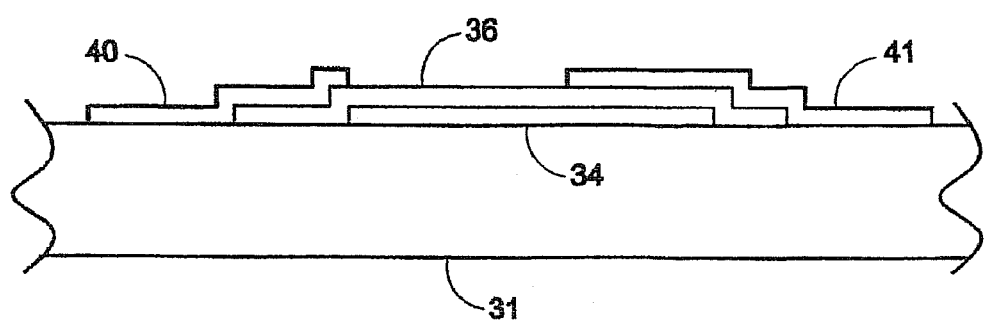
Figure 3:
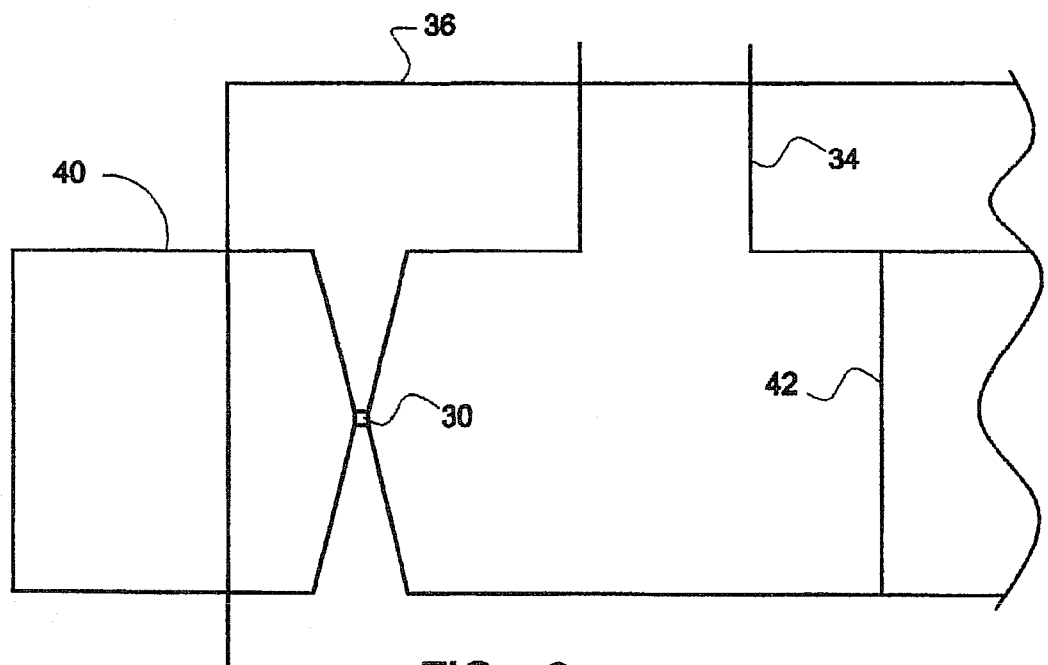

A preferred overlay capacitor 30 is illustrated in FIGS. 2a, 2b, 2c, and 3 that minimizes contributions to $L_{geom}$. The capacitor 30 is deposited directly on a 25 mil alumina substrate 31. A first metal layer 34 bonds to the substrate 31. The shape of metal layer 34 is also illustrated in FIG. 2b. A ferro-electric layer 36 overlies the metal layer 34. To form the overlay capacitor 30, a metal pad 40 formed on the ferro-electric layer 36 overlaps a portion of the first metal layer 34. FIG. 3 illustrates an enlarged view of the overlapping portions. Both the metal pad 40 and the metal layer 34 have a tapering region that forms an overlay capacitor 30 of the appropriate capacitance. An additional metal pad 41 overlaps the metal layer 34 to form a DC blocking capacitor 42. The metal pad 41 is tapered to form an appropriate capacitance for the DC blocking capacitor 42.

Due to the high dielectric constant (κ) of the most likely f-e films to be used, the overlay capacitor 30 may be quite small in area and still provide a capacitance ($C_{f-e}$) of 1.5 pF. A bonding bias pad 44 is provided for attachment of a high value (500–1000 kΩ) chip resistor. Note that the f-e film is deposited not only under the overlay capacitor 30 but also the blocking capacitor 42. However, the effect on the capacitance ($C_{DC}$) of the DC blocking capacitor 42 is irrelevant if $C_{DC} \geq 180$ pF and $C_{f-e} \leq 1.5$ pF, even under maximum $V_{DC}$ bias (preferably 10V DC). This is because the DC blocking capacitor has a high enough capacitance that even when the capacitance is reduced by f-e tuning, it still has a minimal effect on $C_{f-e}$.

In such an embodiment, $0.7 \leq C_{f-e} \leq 1.5$ pF, f-e κ is approximately 1000, the overlapped portion of the metal pad 40 forming the overlap capacitor 30 is approximately 7.0 μm×7.0 μm, and the f-e film thickness is approximately 1.0 μm. The metal layer 34 may be Pt and have a thickness of $\leq 0.5$ μm. The metal pads 40 and 41 may be Ag and have a thickness of approximately 1.5–2.5 μm.

While thin film ($t_{f-e}$ less than about 1.5 μm) f-e materials have been discussed, thick film f-e material can be used as well. Here, "thick film" is defined to be $t_{f-e}$ greater than about 1.5 μm and less than about 1.0 mm. Bulk is greater than about 1.0 mm. The fabrication and application of thick film f-e material is quite different than that of thin film f-e material. It usually involves a paste or a sol-gel technique, and the f-e materials to produce the significantly added thickness. The added thickness and especially reduced cost comes at the price of somewhat degraded f-e performance, notably, reduced tunability.

While the $L_{geom}$ of an overlay capacitor is lower than that of a gap capacitor, $L_{f-e}$ of an overlay capacitor may be higher, as all of the rf field is concentrated in the f-e film. In a gap capacitor the rf field is partially in air, partially in the f-e film and partially in the substrate. For the same reasons, an overlay capacitor has greater capacitance tunability for a given applied voltage than a gap capacitor.

For a given cross sectional area, an IDC can provide a higher capacitance than a gap capacitor. It is more lossy, however, with the main contributions to $L_{geom}$ including the gap spacing; loss increases as the gap spacing decreases. Similarly, loss increases as finger width decreases. The finger length also affects loss with loss increasing as finger length increases; especially in a microstrip (the most common) realization of an IDC as the odd mode loss dominates in such a structure. In addition, loss increases as the number of fingers increases due to loss introduced from the additional sharp corners; note that increasing the number of fingers is typically used to increase the capacitance of an IDC.

Many investigators in the f-e area have used IDC's with narrow finger widths and gaps ($\leq 5.0$ μm for each) to characterize f-e film. This is problematic, as such an IDC structure gives a high $L_{geom}$ and therefore a low Q by itself. Typically, Q is much less than 100 at 2.0 GHz for about 1.0 pF, even without any $L_{f-e}$. This makes it quite difficult to measure $L_{f-e}$. The wide spread use of broad band measurement techniques, as described above, further obfuscates any $L_{f-e}$ measurement.

Figure 4A:
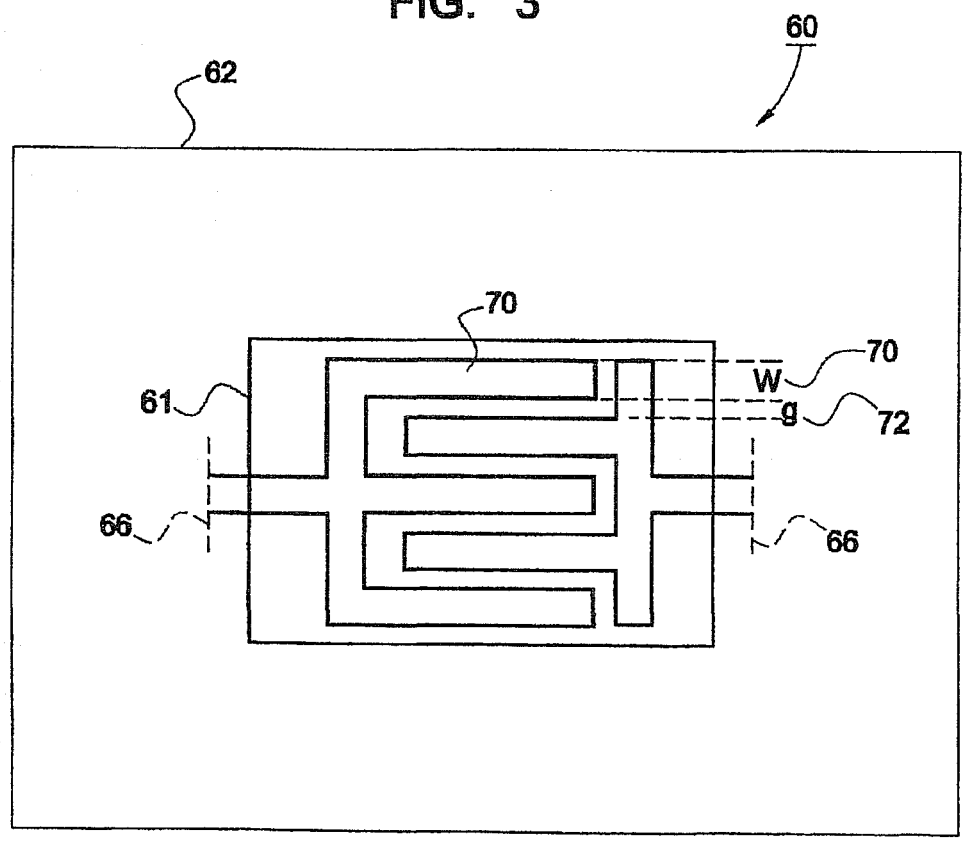
FIG. 4a is a plan view of a ferro-electric interdigital capacitor.

A preferred IDC capacitor 60 is illustrated in FIG. 4 that minimizes the contributions to $L_{geom}$. It is formed on a 99.5% pure alumina, MgO, sapphire or other suitable substrate 62 of thickness of approximately 0.2 to 1.5 mm. A f-e layer 64 is formed on the substrate 62. An input port 66 and output port 68 couple to the IDC capacitor 60. A metal layer 70 having a thickness of 1.5 to 3.0 microns and deposited on the f-e layer 64 forms a gap spacing 72 of approximately 5.0 microns and a finger width 70 of about 150 microns, or greater if possible.

Figure 4B:
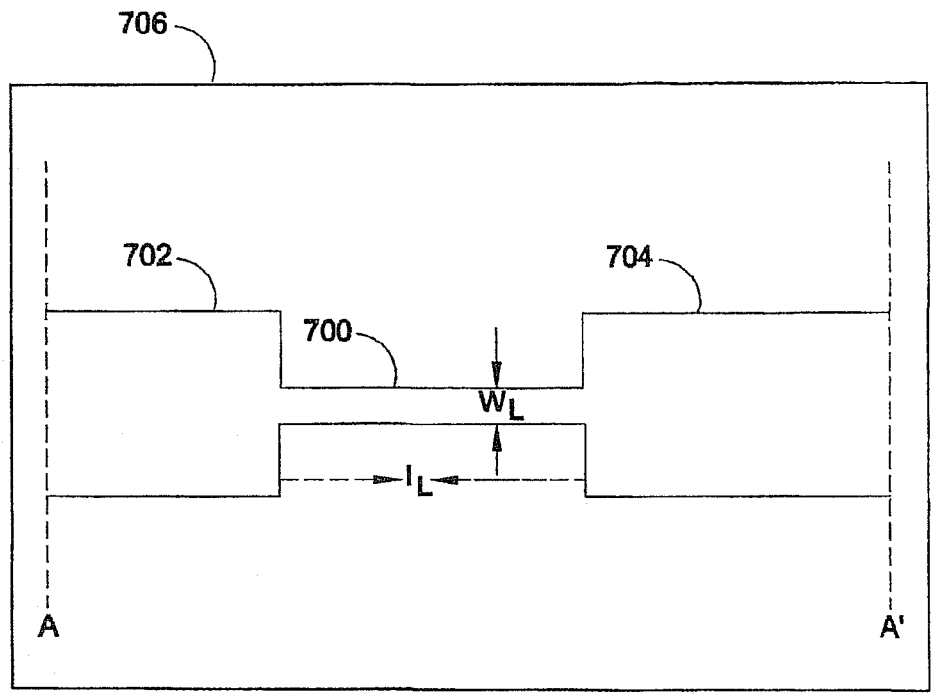
FIG. 4b is a plan view of a ferro-electric microstrip inductor.

A tunable inductor that can be used to create a tunable matching circuit will now be described. Microstrip inductors can be fabricated as short lengths, l, of narrow lines as shown in FIG. 4b. FIG. 4b shows a microstrip inductor 700 electrically connected to and situated between two portions 702 and 704 of microstrip line. The width, $W_L$, and length, $l_L$, are shown in FIG. 4b. Input and output planes A and A' are also shown, for reference to a circuit model shown in FIG. 4c and to be described later.

Note that, $$l_L = \frac{\lambda_g}{4},$$

where $$\lambda_g = \frac{\lambda_o}{\sqrt{\varepsilon_{eff}}};$$

$\varepsilon_{eff}$=the effective dielectric constant;

$$\lambda_o = \frac{c}{f};$$

and c=the speed of light.

The inductor 700 has an inductance, L, given by the following equation:

$$L = \frac{Z_o}{\varpi} \sin\left(\frac{2\pi l}{\lambda_g}\right),$$

where $Z_o$=the characteristic impedance of the narrow, inductive line; and

ϖ=2πf, is the radian frequency of the rf signal.

The effective dielectric constant, $\varepsilon_{eff}$, of the microstrip line can be affected by introducing a thin (thickness, t, $\leq$about 1.5 μm) f-e film on top of the base substrate used in FIG. 4b, and just beneath the metal layer. Bias can be applied to the line. Inductors of this type (single straight microstrip lines) are usually limited to L≦about 1.0 nH. Limiting factors are high resistance associated with a narrow $W_L$ and current carrying requirements as determined by the specific application. Similar inductive lines can be fabricated with bends or spirals, allowing for greater inductance, L, up to about 4.0 nH. Inductors of this type can also be fabricated as coplanar waveguide (CPW) or stripline topologies. Both the inductance value, L, and the tuning range is limited in this approach. The use of thick film f-e fabrication may be of greater benefit for tuning inductors, as it offers a potentially greater variation in $\in_{eff}$ and $Z_0$.

Figure 4C:
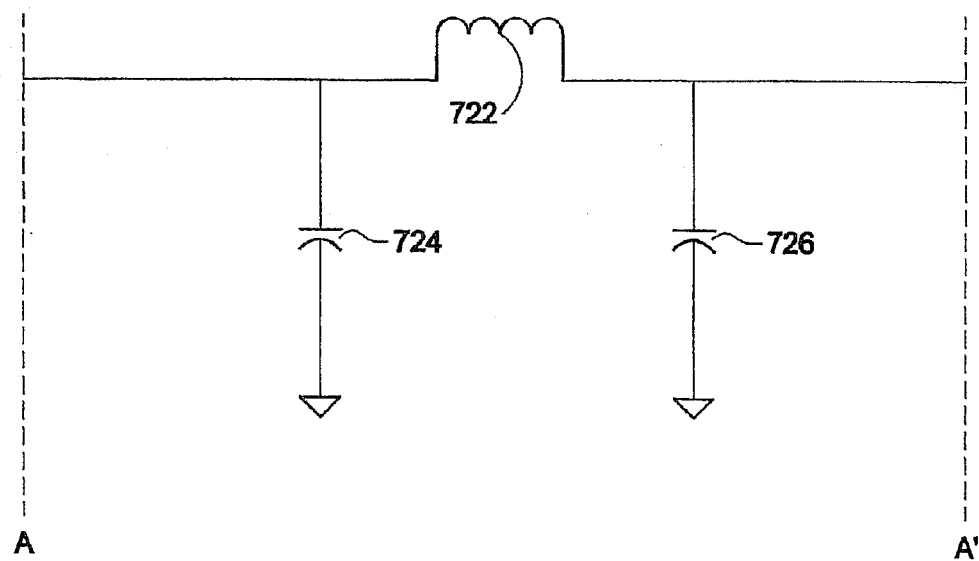
FIG. 4c is a schematic diagram equivalent circuit to the inductor shown in FIG. 4b.

An equivalent circuit model to the circuit in FIG. 4b is shown in FIG. 4c. The inductor 700 is shown as an equivalent inductor 722 in FIG. 4c. There are also capacitors 724 and 726 which represent parasitic capacitances to ground of the microstrip portions 702 and 704 of FIG. 4b. Equivalent input and output planes A and A' are also shown in FIG. 4c. The input and output plane A is coupled to the inductor 722 and to capacitor 724. Capacitor 724 is coupled to ground. Inductor 722 is also coupled to capacitor 726. Capacitor 726 is coupled to ground. Inductor 722 is also coupled to input and output plane A'.

The value of the shunt capacitors 724 and 726 can be exploited in specific circuits. They can, for example, be absorbed by shunt capacitors situated adjacent to the inductor, on both sides.

Figure 5:
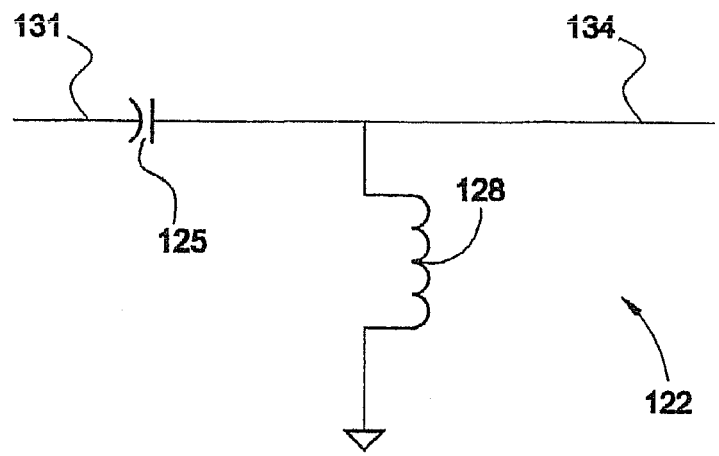
FIG. 5 is a schematic of an exemplary matching circuit.
Figure 6:
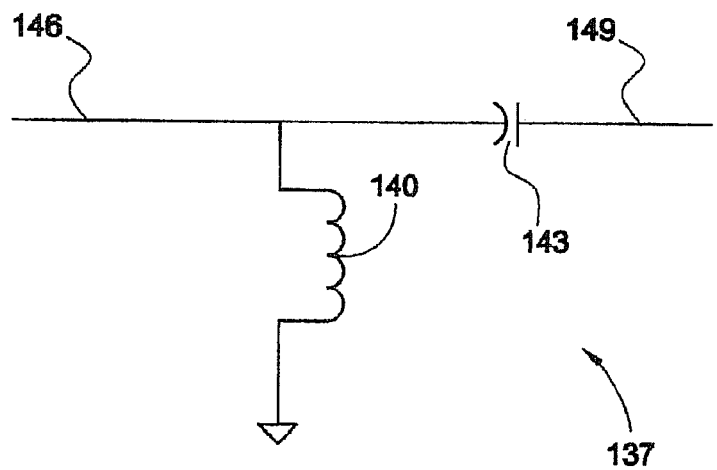
FIG. 6 is a schematic of an exemplary matching circuit.
Figure 7:
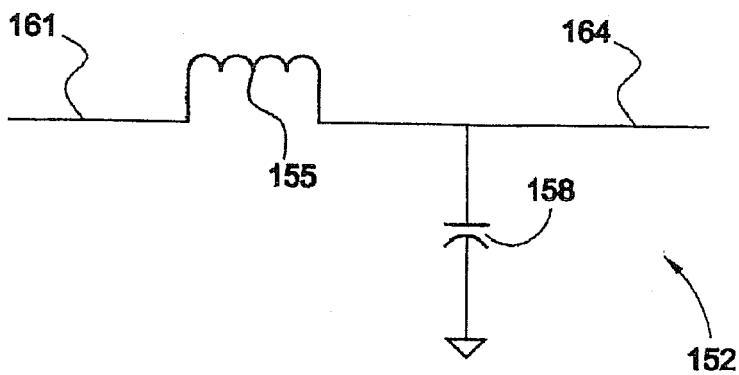
FIG. 7 is a schematic of an exemplary matching circuit.
Figure 8:
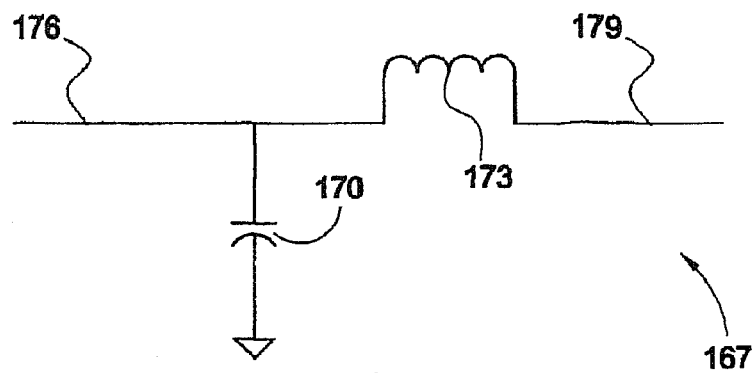
FIG. 8 is a schematic of an exemplary matching circuit.

The matching circuit may be of any topology that is known in the art. Several tunable matching circuits will now be described. With reference to FIG. 5, a tunable matching circuit 122 is shown with a series tunable capacitor 125 and a shunt inductor 128 coupled between an input 131 and an output 134. FIG. 6 shows a tunable matching circuit 137 with a shunt inductor 140 and a series capacitor 143 coupled between an input 146 and an output 149. FIG. 7 shows a tunable matching circuit 152 with a series inductor 155 and a shunt capacitor 158 coupled between an input 161 and an output 164. FIG. 8 shows a tunable matching circuit 167 with a shunt capacitor 170 and a series inductor 173 coupled between an input 176 and an output 179. Alternatively, in any of FIGS. 5–8, the inductor 128, 140, 155, 173 may be tunable, or both the capacitor 125, 143, 158, 170 and inductor 128, 140, 155, 173 may be tunable. Control voltages can be applied to the f-e capacitor by means of the inductors shown in FIGS. 5–8 in many cases. Alternatively, it may be applied to the f-e capacitor by itself by proper design of the capacitor.

Figure 9:
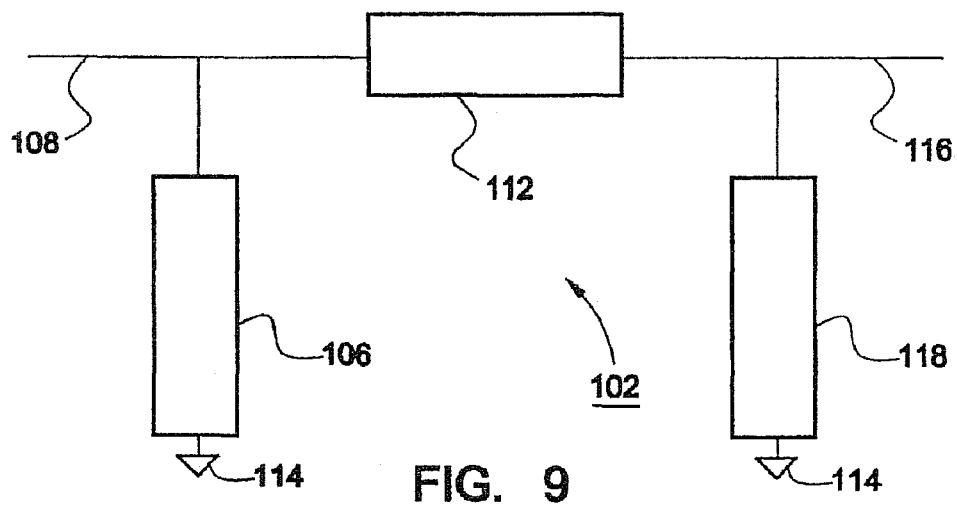
FIG. 9 is a schematic of an exemplary matching circuit.
Figure 10:
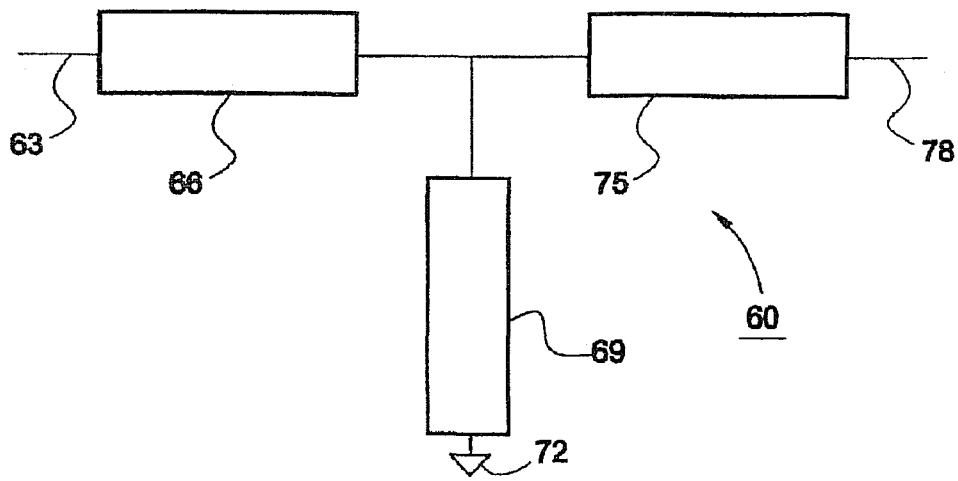
FIG. 10 is a schematic of an exemplary matching circuit.

FIGS. 9 and 10 show more complex matching circuits. FIG. 9 is a block diagram of a pi matching circuit 102. The pi matching circuit 102 has a first reactive element 106 coupled between an input 108 and ground 114. A second reactive element 112 is coupled between the input 108 and an output 116. A third reactive element 118 is coupled between the output 116 and ground 114. Each reactive element 106, 112, 114 may comprise either an inductor or a capacitor. Any or all of the reactive elements may be realized as lumped or distributed elements. At least one of the reactive elements 106, 112, 114 is tunable. This allows for the matching circuit 102 to be tunable.

FIG. 10 is a block diagram of a T matching circuit 60. The T matching circuit 60 has a first reactive element 66 coupled between an input 63 and a second reactive element 69. The second reactive element 69 is coupled between the first reactive element 66 and ground 72. A third reactive element 75 is coupled between the first and second reactive elements 66, 69 and an output 78. Each reactive element 66, 69, 75 may comprise either an inductor or a capacitor. Any or all of the elements shown can be lumped or distributed elements. At least one of the reactive elements 66, 69, 75 is tunable. This allows for the matching circuit 60 to be tunable.

FIGS. 5–10 show representative tunable matching circuits. It will be understood that more complex matching circuits may be constructed by combining the matching circuits shown in FIGS. 5–10 and by adding components in series and in parallel with those components shown.

The capacitance of a f-e capacitor will always decrease with increasing DC (control) voltage. The optimal topology for a matching network must take this into account. A Smith Chart is a useful tool for this purpose. Historically, a Smith Chart was a graphical aid in which a designer could plot the source or load impedance and then choose a matching circuit topology to move the source or load impedance to a desired location, typically to 50Ω.

Alternatively, the f-e material's temperature dependence can be controlled by means of varying the DC control voltage as a function of temperature. One way this can be done is by means of a look-up-table stored in memory along with a temperature sensor, like a diode or thermistor.

F-E temperature dependence can be reduced by appropriate f-e material fabrication as well. In the preferred paraelectric state the material's Curie Temperature is below the operating temperature range. By moving the Curie point lower in temperature, one can achieve less temperature variation in the f-e material. This comes at the expense of less tunability.

The graphical Smith Chart has been implemented on many circuit simulation software packages in wide spread use. Examples are Eagleware(which has a separate matching program as well) and Momentum. These tools can be used to choose the optimum or desirable matching circuit topology and the number of matching elements needed for a given application.

Figure 11:
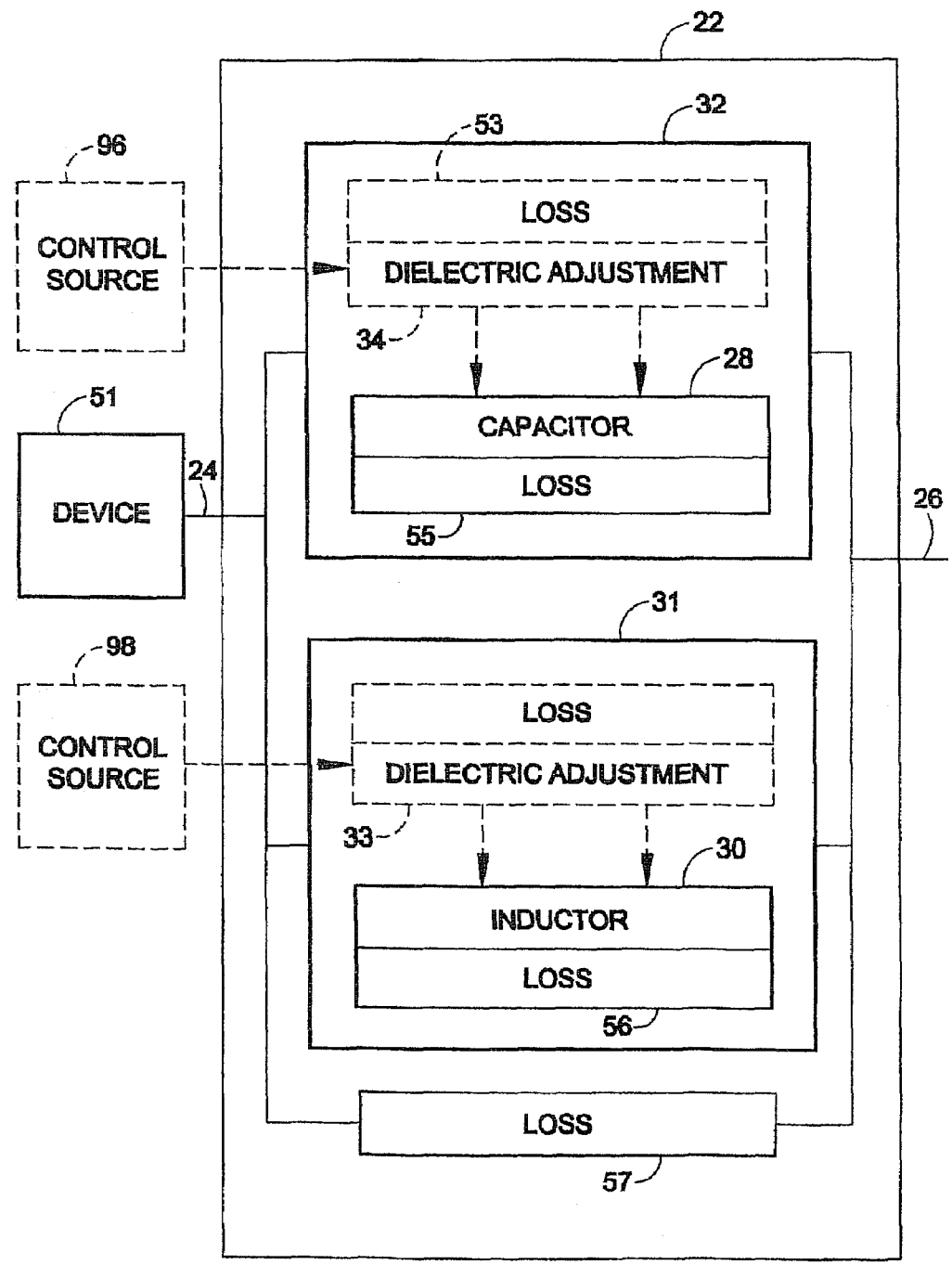
FIG. 11 is a block diagram of a low loss tunable ferro-electric matching circuit.

FIG. 11 is a block diagram showing a dielectric tunable matching circuit 22 used to tune a device impedance 24 to a target impedance 26. The matching circuit 22 is comprised of a capacitor 28 and an inductor 30. In a first embodiment, the capacitor 28 may have a first dielectric constant adjustment mechanism 34. Together, the capacitor 28 and the dielectric constant adjustment mechanism 34 comprise a tunable capacitor 32.

The dielectric constant adjustment mechanism 34 adjusts the dielectric constant of some or all of the dielectric material proximate the capacitor 28. This shifts the capacitance of the capacitor 28. This, in turn, shifts the impedance of the device 51 and the matching circuit 22 combined. In this way, the impedance can be selectively tuned to match the target impedance 26.

In a second embodiment, the inductor 30 may have a second dielectric constant adjustment mechanism 33. Together, the inductor 30 and the second dielectric constant adjustment mechanism 33 comprise a tunable inductor 31. The dielectric constant adjustment mechanism 33 adjusts the dielectric material proximate the inductor 30. This shifts the inductance of the inductor 30. This, in turn, shifts the impedance of the device 51 and the matching circuit 22 combined. In this way, the impedance can be selectively tuned to match the target impedance 26.

In a third embodiment, the matching circuit 22 may have both tunable components, that is, a tunable capacitor 32 and a tunable inductor 31.

In each of the first, second and third embodiments a first control source 96 or a second control source 98 or both will be present to send control signals to the dielectric constant adjustment mechanisms 34 and 33.

The matching of impedances is accomplished while maintaining very low total loss in the matching circuit 22. Five specific losses are shown in FIG. 11. There is a loss 53 associated with the first dielectric constant adjustment mechanism 34. This loss 53 may be the ferro-electric material loss tangent, or $L_{f-e}$. There is a loss 55 associated with the capacitor 28. This loss 55 may be a combination of $L_{metal}$ and $L_{geom}$. There is a loss 54 associated with the second dielectric constant adjustment mechanism 33. This loss 54 may be the ferro-electric material loss tangent, or $L_{f-e}$. There is a loss 56 associated with the inductor 32. This loss 56 may be a combination of $L_{metal}$ and $L_{geom}$. Finally, there is a loss 57 associated with the entire matching circuit 22. This loss 57 may be a combination of $L_{attach}$, $L_{sub}$ and $L_{rad}$.

Each of these losses is eliminated or bounded by the techniques discussed above. Thus, this matching circuit 22 introduces sufficiently low loss to be usable in a wireless handset or other communication systems requiring low loss.

F-E tunable matching circuits can be used in several places in a wireless handset. Specifically, they can be used in, but are not limited to, matching an antenna to a duplexer, diplexer or multiplexer and for matching at the input and output of PA's and LNA's. They can also be used in the intermediate frequency (IF) strip to provide tuning there, if needed.

Figure 12:
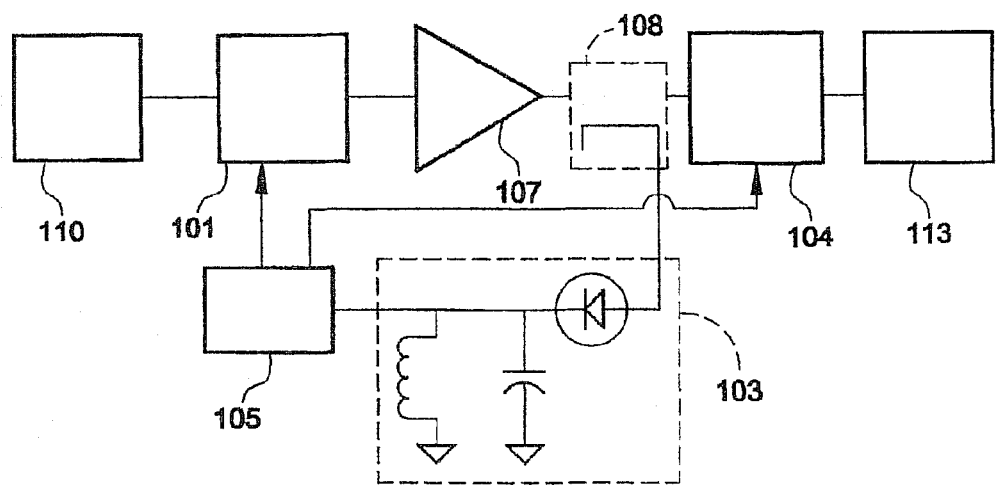
FIG. 12 is a block diagram of a matching circuit and surrounding circuitry for an amplifier.

FIG. 12 shows a block diagram of two matching circuits 101 and 104 coupled to an amplifier 107. The amplifier 107 may be either a power amplifier (PA), a low noise amplifier (LNA) or any other suitable amplifier. The first matching circuit 101 sets the impedance seen by an input circuit 110 to a first target impedance. The target impedance may differ from the input impedance of the amplifier 107. The matching circuit 101 compensates for this difference. A second matching circuit 104 sets the impedance seen by the amplifier 107 to a second target impedance. The second target impedance may be equal to the first target impedance.

Matching can be achieved over a wider range of frequencies while still maintaining the device's narrow band characteristics. Being able to control the impedance of an amplifier while it is being tuned reduces loss in the signal path.

The control of matching circuits 101 and 104 may be implemented by power sampling circuit 108, power detecting circuit 103 and control circuit 105 as shown in FIG. 12. Power sampling circuit 108 is coupled to the output of amplifier 107. It samples the power output of amplifier 107 and transfers this signal to power detector circuit 103. Power detect circuit 103 detects the power level of amplifier 107 and transfers this signal to control circuit 105. Control circuit 105 receives the power level detected by power detector circuit 103 as an input and produces a control signal as an output. The control signal varies the DC voltage applied to the f-e material in the matching circuits 101 and 104. Thus, the matching circuits 101 and 104 are responsive to the power output of amplifier 107.

Together, power sampling circuit 108, power detecting circuit 103 and control circuit 105 comprise a control source. Note that power detector circuit 103 is shown as a diode, a capacitor and an inductor for the purpose of illustration only. Any suitable power detector may be used.

Figure 15:
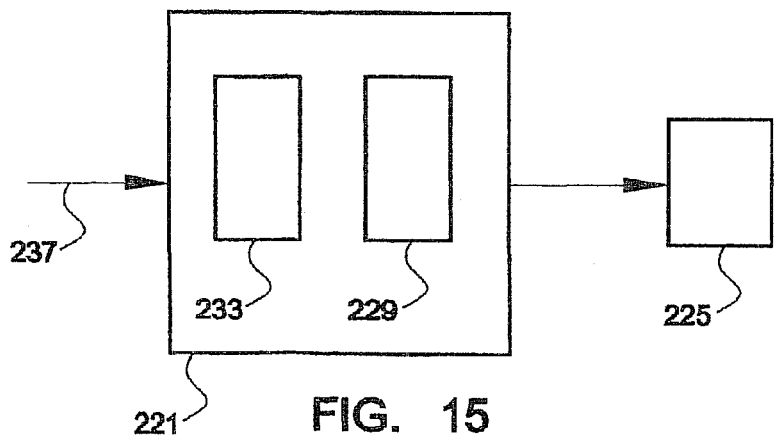
FIG. 15 is a block diagram of a control source and a matching circuit.

An alternate control source is shown in FIG. 15. A band select signal is received as an input 237 to control source 221. Control source 221 comprises a voltage source 223 and a look-up table 229. Responsive to the band select signal, the control source 221 looks up a value in the look-up table 229 corresponding to the band selected. The value represents a voltage to be applied by the control source 221 to the matching circuit 225. The voltage comprises a control signal, changing the impedance of the matching circuit 225.

F-E tuning in PA's can not only electrically adjust the output impedance match for a given device initially and optimize it over temperature, but can also dynamically vary the load line of a PA given the known required power output. The ability to optimize a PA's load line under a wide range of output power is key to obtaining optimum power efficiency and thus minimizing the power consumption on the D.C. power source, i.e., a battery in the case of wireless handsets. This increases talk time and reduces heat dissipation.

The maximum output power that a f-e tunable amplifier can handle is limited by the f-e material's non-linearity and the overall system requirements. For wireless handsets there are appropriate standards, like IS-95 or IS-98, that define the tolerable limits on transmit (PA) non-linearity in terms of adjacent and/or co-channel interference. Improving a PA's linearity has a direct, positive effect in that a smaller device and/or less bias current needs to be used to meet these standards. The linearity of the f-e material must be considered. The f-e materials described herein have some non-linearity. The particular choice of f-e film will be determined by the tolerance of a given system to non-linearity.

Additionally, increased output power can be achieved by conventional paralleling of devices, as is apparent to anyone skilled in the art. F-E tunability can be exploited in these cases as well.

F-E materials can also benefit LNA's. LNA's can electrically adjust for the optimum input impedance match of a device, along with the output, to provide for optimum noise figure and intercept point. As is the case of the PA, this can be controlled over temperature, as well. Amplifier performance changes over temperature. This may create impedance mismatches at different temperatures and/or a shift in the active device's operating point. F-E tunability can be used to compensate for this impedance mismatch by appropriate choice of:

1) f-e material temperature characteristics, and/or;
2) matching topology chosen.

Tunability allows for an LNA and a PA to be operated optimally over more than one band. This is especially useful in wireless handsets because the amount of space in a handset is limited and many operating bands are closely spaced. Space savings are proportional to the number of independent components for different bands that are eliminated by adding tunable components. Tunability allows a handset manufacturer to have fewer different PA and LNA designs on hand to build handsets for a diverse market. It also allows for operation of handsets over wide geographic regions without requiring multiple PA's and LNA's. For example, one PA or LNA can cover multiple PCS bands, such as, for example, the Korean, Indian, and U.S. PCS bands.

The resulting improved match will translate to increased antenna gain, further improving handset performance, both for the transmit side (lower required PA power, more linearity) and the receive side (increased sensitivity, less LNA bias current needed).

Figure 13:
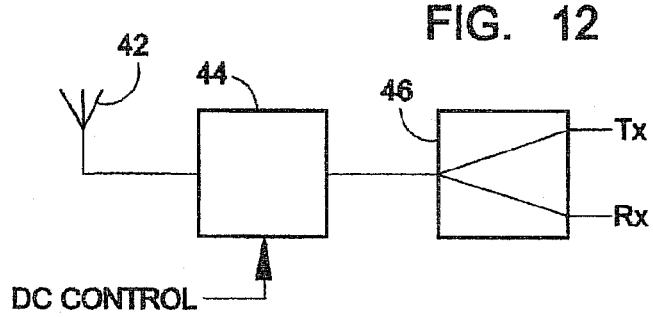
FIG. 13 is a block diagram of a matching circuit between an antenna and a duplexer.
Figure 14:
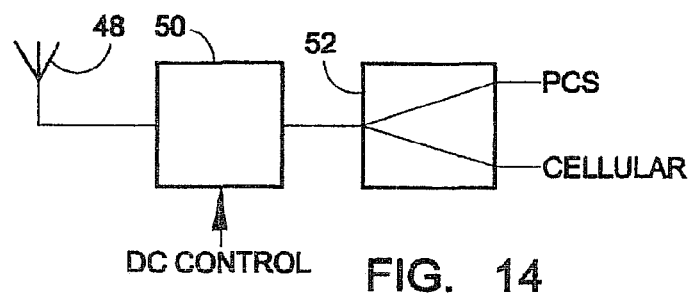
FIG. 14 is a block diagram of a matching circuit between an antenna and a diplexer.

Another example of a tunable matching circuit is a matching circuit for matching an impedance of an antenna to the impedance of either a duplexer or a diplexer. These configurations are shown in FIGS. 13 and 14. In FIG. 13, an antenna 42 is coupled to a matching circuit 44. The matching circuit 44 is coupled to a duplexer 46. The matching circuit 44 sets the impedance seen by the antenna 42 to a target impedance. The target impedance may be different from the input impedance of the duplexer 46. The matching circuit 44 compensates for this difference. The matching impedance also sets the impedance seen by the duplexer 46 to a target impedance. This target impedance may be different from the input impedance of the antenna 42. The matching circuit 44 compensates for this difference.

In FIG. 14, an antenna 48 is coupled to a matching circuit 50. The matching circuit 50 is coupled to a diplexer 52. The matching circuit 50 sets the impedance seen by the antenna 48 to a target impedance. The target impedance may be different from the input impedance of the diplexer 52. The matching circuit 50 compensates for this difference. The matching impedance also sets the impedance seen by the diplexer 52 to a target impedance. This target impedance may be different from the input impedance of the antenna 48. The matching circuit 50 compensates for this difference. The diplexer is shown as providing for the PCS and cellular bands. This is by way of example only. The diplexer could provide for other bands, it could be replaced by a multiplexer providing for more than two bands.

Note that a control signal is applied to the matching circuits 44 and 50 of FIGS. 13 and 14, respectively. This control signal may be generated in a manner similar to those in FIGS. 12 or 15, or any other suitable method. A power sampler may be applied, for example at the duplexer 46 Tx or Rx ports, or at the diplexer PCS or cellular ports.

The resulting improved match will translate to increased antenna gain, further improving handset performance, both for the transmit side (lower required PA power, more linearity) and the receive side (increased sensitivity, less LNA bias current needed).

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

The invention claimed is:

1. A communication device comprising:
   a capacitive element and an inductive element arranged as a matching circuit, the matching circuit having an impedance;
   a ferro-electric material positioned to adjust a value that is a member of the group consisting of a capacitance value of the capacitive element and an inductive element value of the inductor;
   a control line operably connected to the ferro-electric material; and
   a control source electrically connected to the control line, the control source configured to transmit a control signal on the control line;
   wherein the ferro-electric material, responsive to the control signal, adjusts the value to change the impedance of the matching circuit.

2. The communication device of claim 1, wherein the control source comprises a lookup table and varies the control signal responsive to a value in the lookup table.

3. The communication device of claim 2, further comprising a temperature sensor coupled to the control source and wherein the value corresponds to a temperature sensed by the temperature sensor.

4. The communication device of claim 3, wherein the temperature sensor comprises a thermistor.

5. The communication device of claim 2, further comprising:
   a band select signal generator coupled to the control source and wherein:
   the value in the lookup table corresponds to a selected band and
   the control signal comprises a voltage to be applied by the control source to the matching circuit.

6. The communication device of claim 5, wherein the band select signal generator comprises a selector for selecting at least one of the United States personal communication system (PCS) band and the United States cellular band.

7. The communication device of claim 2, wherein lookup table comprises a second value representing a measured temperature and the first value in the lookup table represents a control signal voltage for the control source to apply to the matching circuit.

8. The communication device of claim 1, wherein the capacitive element comprises a capacitor and the inductive element comprises an inductor.

9. The communication device of claim 1, wherein:
   the capacitive element is coupled between an input and an output; and
   the inductive element is coupled between the output and ground.

10. The communication device of claim 1, wherein:
    the inductive element is coupled between an input and ground; and
    the capacitive element is coupled between the input and an output.

11. The communication device of claim 1, wherein:
    the inductive element is coupled between an input and an output and the capacitive element is coupled between the output and ground.

12. The communication device of claim 1, wherein:
    the capacitive element is coupled between an input and ground; and
    the inductive element is coupled between the input and an output.

13. The communication device of claim 1, wherein:
    the capacitive element comprises a capacitor, the capacitor comprising a gap; and
    the ferro-electric material is positioned in or near the gap for adjusting the capacitance value of the capacitor.

14. The communication device of claim 1, further comprising an amplifier coupled to the matching circuit.

15. The communication device of claim 14, wherein the amplifier is a low noise amplifier.

16. The communication device of claim 14, wherein the amplifier is a power amplifier.

17. The communication device of claim 16, wherein the control source comprises a look-up table, the look-up table comprising at least one power output value, and wherein the control source varies the control signal to vary the load line of the power amplifier responsive to the at least one power output value.

18. The communication device of claim 14, further comprising:
    a second capacitive element and a second inductive element arranged as a second matching circuit, the second matching circuit having a second impedance and wherein:
    the first matching circuit is coupled to a first signal port of the amplifier; and
    the second matching circuit is coupled to a second signal port of the amplifier;

a second ferro-electric material positioned to adjust at least one of a second capacitance of the second capacitive element and a second inductance of the second inductive element;

a second control line operably connected to the ferro-electric material; and a second control source electrically connected to the second control line, the second control source configured to transmit a second control signal on the second control line;

wherein the second ferro-electric material, responsive to the second control signal, adjusts at least one of the second capacitance and the second inductance to change the impedance of the matching circuit.

19. The communication device of claim 18, wherein the first impedence and the second impedence are substantially equal.

20. A tunable matching circuit comprising:

a capacitive element and an inductive element arranged as a matching circuit, the matching circuit having an input conductor and an output conductor and the matching circuit having an impedance;

a ferro-electric material positioned to adjust at least one of a capacitance of the capacitive element and an inductance of the inductive element, responsive to a changing dielectric constant, responsive to an electric field condition of the ferro-electric material: and a bias pad connected to the ferro-electric material.

21. The matching circuit of claim 20, wherein the capacitive element comprises a capacitor and the ferro-electric material is positioned in or near a gap of the capacitor for adjusting the capacitance of the capacitor.

22. The matching circuit of claim 21, wherein the capacitor comprises an overlay capacitor.

23. The matching circuit of claim 22, wherein the capacitor comprises a conducting layer connected to a substrate dielectric material;

the ferroelectric material comprising a ferroelectric layer overlying at least a portion of the conducting layer; and a second conducting layer overlying at least a portion of the first conducting layer and at least a portion of the ferroelectric layer.

* * * * *